United States Patent
Clothier et al.

(10) Patent No.: US 8,294,023 B2
(45) Date of Patent: Oct. 23, 2012

(54) RADIOISOTOPE POWER SOURCE

(75) Inventors: Brent Allen Clothier, Clifton Park, NY (US); Matthew Christian Nielsen, Scotia, NY (US); Todd Ryan Tolliver, Clifton Park, NY (US); Allen Lawrence Garner, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 311 days.

(21) Appl. No.: 12/608,589

(22) Filed: Oct. 29, 2009

(65) Prior Publication Data

US 2011/0100439 A1 May 5, 2011

(51) Int. Cl.
- H01L 31/00 (2006.01)
- H01M 14/00 (2006.01)
- G21H 1/00 (2006.01)
- C09K 11/54 (2006.01)
- C09K 11/72 (2006.01)

(52) U.S. Cl. ............ 136/253; 136/261; 136/262; 429/5; 310/303; 252/301.6 S; 252/301.6 R

(58) Field of Classification Search .................. 136/253, 136/243, 244, 252, 257, 258, 254, 202, 261, 136/262; 310/303; 429/5; 252/301.5, 301.6 R, 252/301.6 S, 301.6 P, 301.6 F, 301.4 S, 301.4 P, 252/301.4 F See application file for complete search history.

(56) References Cited

U.S. PATENT DOCUMENTS

| | | | |
|---|---|---|---|
| 5,124,610 A | 6/1992 | Conley et al. | |
| 5,721,462 A * | 2/1998 | Shanks | 310/303 |
| 6,911,711 B1 | 6/2005 | Shimabukuro et al. | |
| 7,301,254 B1 | 11/2007 | Lal et al. | |
| 7,304,309 B2 | 12/2007 | Suhami | |
| 2006/0185719 A1* | 8/2006 | Putnam | 136/253 |

FOREIGN PATENT DOCUMENTS

| | | |
|---|---|---|
| WO | WO0022629 A1 | 4/2000 |
| WO | WO2008051216 A2 | 5/2008 |

OTHER PUBLICATIONS

Fleurial et al., "Nanostructured Bulk Thermoelectric Materials", Contact author: jean-pierre.fleurial@jpl.nasa.gov, pp. I-04-1 to I-04-8.

Dresselhaus et al., "New Directions for Low-Dimensional Thermoelectric Materials", Adv. Mater., vol. 19, pp. 1-12, 2007.

* cited by examiner

*Primary Examiner* — Jonathan Johnson
*Assistant Examiner* — Alexander Kollias
(74) *Attorney, Agent, or Firm* — Joseph J. Christian

(57) ABSTRACT

A radioisotope power sources that includes radioisotope nanoparticles and scintillator materials. An embodiment of the radioisotope power source includes radioisotope nanoparticles suspended within a polycrystalline scintillator; additional polycrystalline scintillator at least partially surrounding the polycrystalline scintillator with the radioisotope nanoparticles; and a photovoltaic device in light communication with the surrounding polycrystalline scintillator. A system that employs the radioisotope power source and a method of generating an electrical current are also disclosed. The present invention has been described in terms of specific embodiment(s), and it is recognized that equivalents, alternatives, and modifications, aside from those expressly stated, are possible and within the scope of the appending claims.

13 Claims, 2 Drawing Sheets

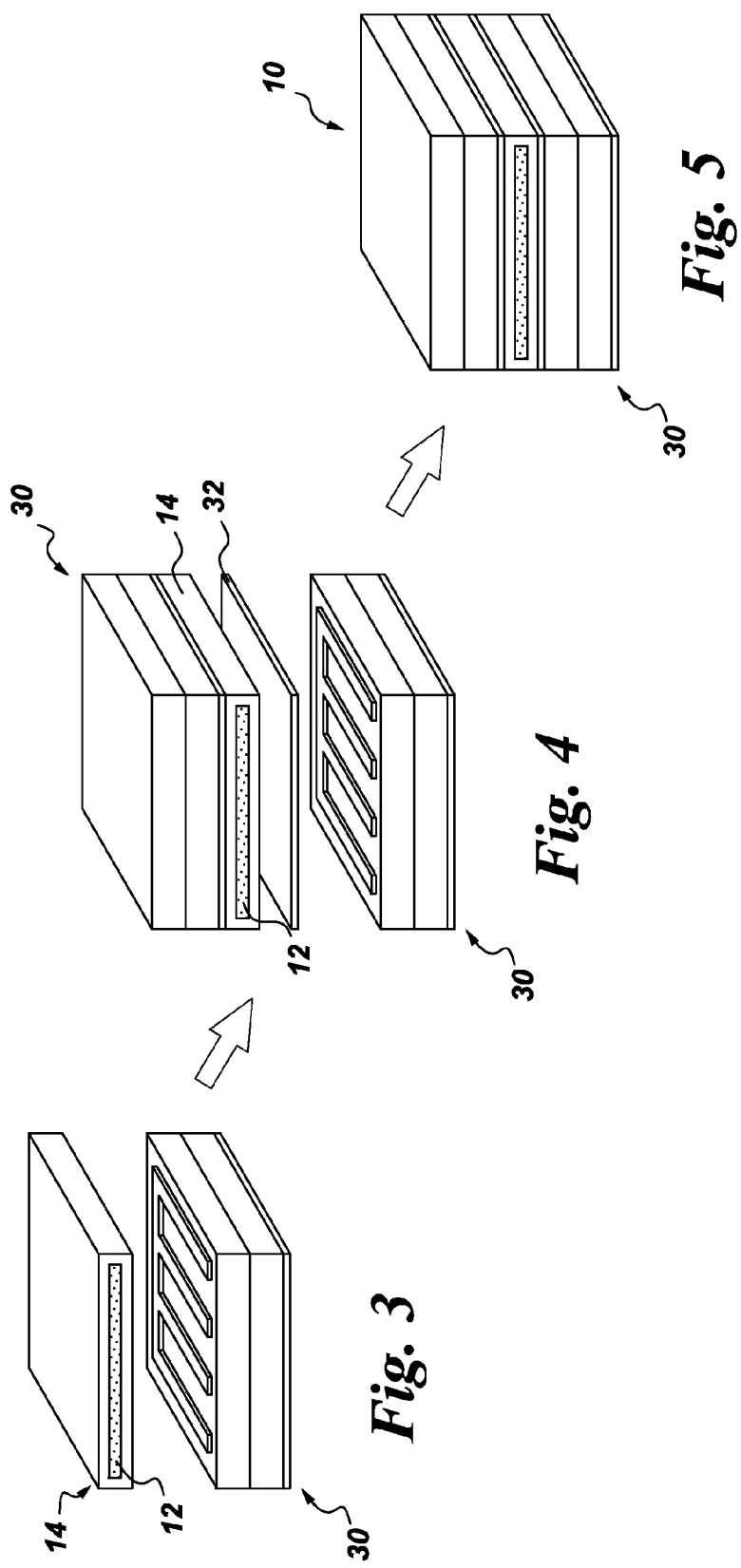

RADIOISOTOPE POWER SOURCE

BACKGROUND OF THE INVENTION

The present invention relates generally to radioisotope power sources and more particularly to a radioisotope nanoparticle-based power source and systems of use thereof.

There is an increasing need to develop miniature (e.g., less than 10 cm$^3$), very long-life (e.g., greater than 10 years) power generation sources for remote and/or harsh environment applications as well as for portable devices. In such situations it is often impractical to supply direct, continuous power, or, alternatively, unsafe or costly to frequently change a depleted power generation source.

Just some examples of these difficult power generation scenarios include sensors in the nuclear power industry, satellite generators, military hardware, biomedical implants, and the like.

Conventional approaches relying on electrochemical energy suffer from inadequate energy densities to meet the demands of very long-life applications, unless this inadequacy is compensated by cumbersome volumes. While the use of radioisotopes has been explored, it is not without its own shortcomings. Safe processing and disposal of radioisotopes as well as radiation exposure and damage to adjacent materials (e.g., photovoltaic device) are just some of the current shortcomings with using radioisotopes.

Accordingly, there is an ongoing need for further improving the durability, life and/or power density of power source technologies.

BRIEF DESCRIPTION

The present invention overcomes at least some of the aforementioned drawbacks in current power source technologies. More specifically, the present invention is directed to provide a device, a radioisotope power source, a system that employs the radioisotope power source, and a method of generating an electrical current.

Therefore, in accordance with one embodiment of the present invention a radioisotope power source includes a first material comprising a polycrystalline scintillator and a radioisotope nanoparticle suspended therein; a second material at least partially or fully surrounding the first material, wherein the second material comprises a polycrystalline scintillator; and a photovoltaic device in light communication with the second material.

According to another embodiment of the present invention, a device includes a substantially transparent matrix comprising radioisotope nanoparticles and a scintillator material; and a photovoltaic device is light communication with the substantially transparent matrix.

According to another embodiment of the present invention, a system includes a radioisotope power source comprising: radioisotope nanoparticles suspended in a substantially transparent scintillator material; and a photovoltaic device is in light communication with the substantially transparent scintillator material; and an electrical device in electrical communication with the radioisotope power source.

According to another embodiment of the present invention, a method of generating an electrical current includes embedding nanoparticles of a radioisotope-containing material within a first scintillator matrix; fabricating the scintillator matrix into an substantially transparent body; encapsulating the substantially transparent body into a substantially transparent body devoid of any radioisotope-containing material; and attaching a photovoltaic device to the substantially transparent body devoid of any radioisotope-containing material.

Various other features and advantages of the present invention will be made apparent from the following detailed description and the drawings.

BRIEF DESCRIPTION OF THE DRAWINGS

The drawings illustrate one embodiment presently contemplated for carrying out the invention.

FIGS. 3-5 are sequential perspective views of a method of making a radioisotope power source according to an embodiment of the present invention.

DETAILED DESCRIPTION

Aspects of the present invention offer advantages over previous power sources. Aspects of the present invention include a miniature (<10 cm$^3$), very long life (>10 years) power generation source based on the decay of radioisotopes. The power generation mechanism results from essentially two processes: the conversion of isotope radiation to photons; and, the conversion of photons into electric current. The former process may be enabled by a unique composite structure wherein nanoparticles of radioisotope-bearing material are embedded within a scintillator-matrix. The later process may use a high-efficiency photovoltaic device to absorb light emitted from the nanocomposite structure and output electric current. In an embodiment, the photovoltaic device is made from a material having a band-gap that matches an emission wavelength of the scintillating composite.

The use of nano-scale radioisotope material allows for virtually 100% of the radiation to be transferred directly to the scintillator matrix within which it originates without any self-absorption within its source. Further, the nano-scale dimensions of the radioisotope material used (e.g., less than c. ⅕ the wavelength of visible light) make any inclusions "transparent" to common scintillator emissions. This characteristic prevents the scattering at any interface (i.e., with the scintillator matrix) where refractive-index mismatches occur. As a result, despite the composite nature the core, emissions within the scintillator can traverse the body unimpeded to the surface. This increases the efficiency of the device so that virtually all light (e.g., visible and/or ultraviolet light) generated by the scintillator material may be captured by any photovoltaic device. Additionally, by incorporating a nanoparticle dispersion of the radioisotope material, atomic-scale is approximated. The nanoparticle volume fraction serves to control the radiation flux experienced by the matrix, providing a tunable parameter to balance light output against long-term radiation damage. This aspect is particularly well suited if alpha particles are used due to the very small penetration depths of this type of radiation.

Figure 1:
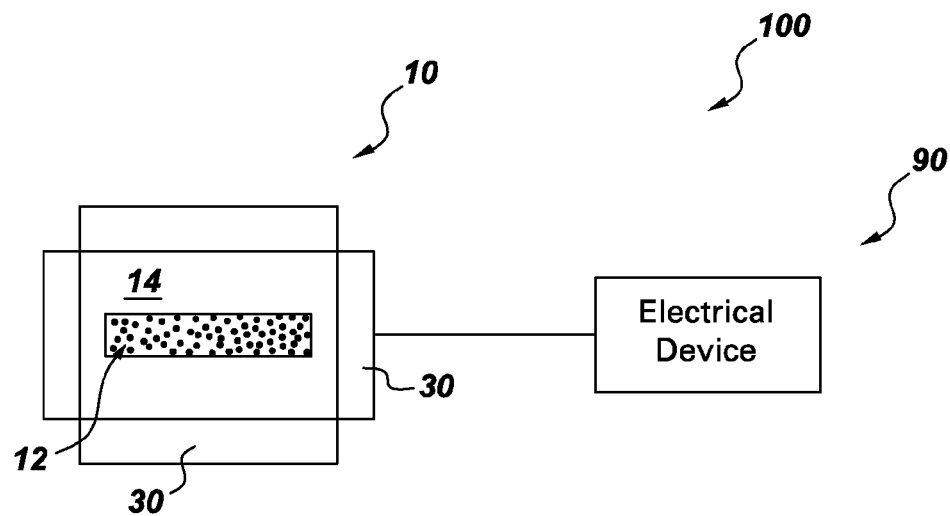
FIG. 1 is a schematic diagram of a system employing a radioisotope power source incorporating aspects of the present invention.
Figure 2:
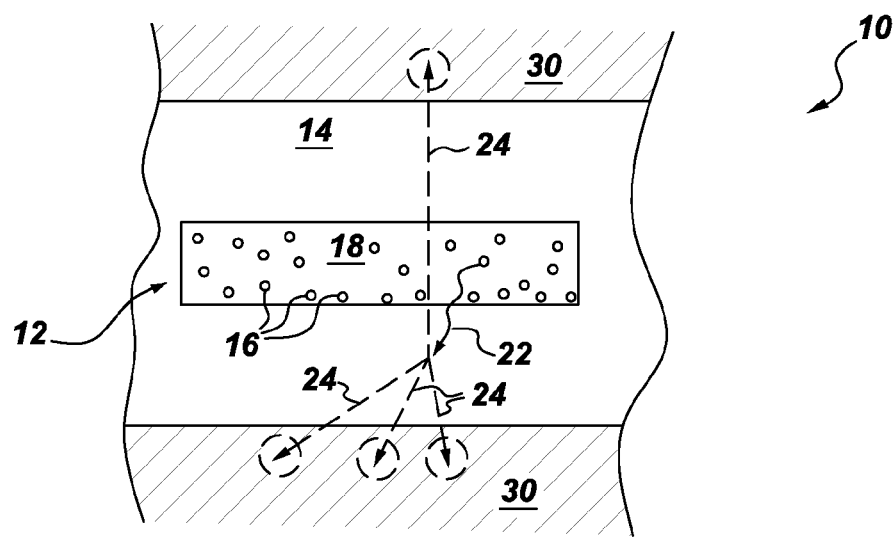
FIG. 2 is a close-up sectional elevation view of a radioisotope power source according to an embodiment of the present invention.

Referring to FIGS. 1 and 2, a device 10 in accordance with an embodiment comprises a first material comprising a polycrystalline scintillator 12 and radioisotope nanoparticles 16 suspended therein. The first material 12, 16 is at least partially surrounded by a second material comprising a polycrystalline scintillator 14. In light communication with the second material 14 is a photovoltaic device 30. The device 10 may be in electrical communication to an electrical device 90 thereby defining a system 100. The term in light communication means that there is an available path for light (e.g., visible and/or ultraviolet) to travel without scattering between at least two elements.

Various electrical devices 90 may be used as part of the system 100. As a non-limiting example, the electrical device 90 may comprise any microelectronics processor or memory, a microelectromechanical system (MEMS), or a faster-discharging battery, such as an ultracapacitor bank, a chemical bank, and the like.

In this manner radiation 22 (FIG. 2) from a decaying radioisotope nanoparticle 16 is absorbed by a polycrystalline scintillator 14 which re-emits the energy in the form of visible or ultraviolet light 24. The radiation 22 can comprise neutrons, gamma-rays, beta-rays or alpha particles depending on the type of radioisotope nanoparticle 16 employed. For example, if gamma rays are emitted, it is in the form of high-energy photons; if beta-rays are emitted, it is in the form of high-energy electrons; and, if alpha particles are emitted, it is in the form of charged helium nuclei. Various materials may be used for the radioisotope nanoparticles 16. For example, the radioisotope nanoparticles 16 may comprise 3-H, 60-Co, 90-Sr, 137-Cs, 148-Gd, 232-U, 241-Am, 244-Cm, and 238-Pu.

Depending on the type of radiation 22 emitted, additional shielding (not shown) may be added in the device 10. For example, shielding may be added so as to surround the photovoltaic device 30 or other elements of the device 10.

As shown in FIG. 2 the conversion of radiation 22 to photons 24 can be maximized by matching the scintillator 14, 18 to the radiation-type and energy on the basis of light output. For example, if beta radiation 22 is emitted, then Eu-doped $CaF_2$ may be employed as the scintillator 14, 18. Conversely, if alpha radiation 22 is emitted, then Ag-doped ZnS or its (Zn,Cd)S analogues may be employed as the scintillator 14, 18. Other examples of suitable materials that may comprise the scintillator 14, 18 include Eu-doped $Y_2O_3$ or Ce-doped $Y_2SiO_5$. Clearly, other known or later developed materials may be used as suitable scintillator materials under aspects of the present invention.

As shown in FIG. 2 the emission 24 from the scintillator 14 is collected by a photovoltaic device 30 and converted into an electrical current. In an embodiment, a band-gap of the photovoltaic device 30 may be matched to a wavelength of the scintillator emission 24 so as to maximize the efficiency of the conversion process. Non-limiting examples of suitable substrate materials for the photovoltaic device 30 include Si, SiC, GaP, GaAs, InP, $GaInP_2$, CdTe, and InGaN. Other examples of possible substrate materials for the photovoltaic device 30 include other ternary semiconductors such as $AlAs_{1-x}Sb_x$, $Al_{1-x}Ga_xAs$, $Als-1Ga_xSb$, $In_{1-x}Ga_xN$, $In_{1-x}Ga_xP$, $In_{1-x}Ga_xAs$, $InP_{1-x}As_x$, $Cd_{1-x}An_xTe$, $CuIn_xGa_{1-x}Se_2$, and the like. Clearly, other known or later developed materials may be used as suitable photovoltaic device materials under aspects of the present invention.

The unique nanocomposite structure of the device 10 comprises the use of nanoparticles 16 of radioisotope-containing material embedded within a scintillator matrix 18. The nanocomposite body 12 is fabricated into a substantially transparent body, which, in turn is encapsulated within a larger scintillator-only body 14 that is also substantially transparent. As depicted in FIG. 2, the use of $90\text{-}SrF_2$ nanoparticles 16 may be employed. The scintillator-only body 14 (e.g., shell) serves to completely absorb radiation 22 emitted at a core surface 17 (i.e., not absorbed by the scintillator 18 in the matrix of the core 12), thus scavenging otherwise lost energy and protecting photovoltaic device(s) 30 from radiation damage. In another embodiment, the scintillator-only body 14 may be made of a single crystal scintillator material. In still another embodiment, instead of locating a scintillator material between the nanocomposite body 12 and the photovoltaic device 30, a substantially transparent (e.g., non-scintillator material) material may be used.

FIGS. 3-5 show sequential perspective views of a method of making the device 10. The core-shell body 12, 14 may be attached to the photovoltaic device 30 via a film 32 of optically-transparent, inorganic low-melting point glass. The ability of the glass 32 to flow at reduced temperature (e.g., <400° C.) ensures the preservation of the photovoltaic device 30 and its inorganic, amorphous nature brings significant radiation hardness. Other suitable attachment means may be employed between the core-shell body 12, 14 and the photovoltaic device 30. For example, substantially transparent grease or epoxy may be placed between the core-shell body 12, 14 and the photovoltaic device 30 so as to provide suitable attachment means.

In this manner, the device 10 is capable of power generation of at least about 1 mW in a small volume. In another embodiment, the device is capable of power generation of at least about 1 µW. The volume of the device 10 may be, for example, less than about 10 $cm^3$. In other embodiments, the volume may be less than about 5 $cm^3$, while in other embodiments the volume of the device 10 may be less than about 2.5 $cm^3$. The life of the device 10 may exceed 10 years. In other embodiments, the life may exceed 20 years, while in other embodiments the life may exceed 25 years.

Various shapes for the device 10 may be used under aspects of the present invention. For example, the device 10 and its concomitant elements (e.g., 12, 14, etc.) may be rectangular, cubic, spheroid, and the like. However, other shapes and configurations may be used without departing from the intent of aspects of the present invention.

Various configurations of scintillator material and radioisotope nanoparticles may be used under aspects of the present invention. For example, in another configuration, there may be only a first material comprising polycrystalline scintillator and radioisotope nanoparticles suspended therein (without a second pure polycrystalline scintillator material). Similarly, the first material may extend to the edge of the photovoltaic device 30 in an embodiment.

Therefore, according to one embodiment of the present invention a radioisotope power source includes a first material comprising a polycrystalline scintillator and a radioisotope nanoparticle suspended therein; a second material at least partially or fully surrounding the first material, wherein the second material comprises a polycrystalline scintillator; and a photovoltaic device in light communication with the second material.

According to another embodiment of the present invention, a device includes a substantially transparent matrix comprising radioisotope nanoparticles and a scintillator material; and a photovoltaic device is light communication with the substantially transparent matrix.

According to another embodiment of the present invention, a system includes a radioisotope power source comprising: radioisotope nanoparticles suspended in a substantially transparent scintillator material; and a photovoltaic device is light communication with the substantially transparent scintillator material; and an electrical device in electrical communication with the radioisotope power source.

According to another embodiment of the present invention, a method of generating an electrical current includes embedding nanoparticles of a radioisotope-containing material within a first scintillator matrix; fabricating the scintillator matrix into an substantially transparent body; encapsulating the optically-transparent body into a substantially transparent body devoid of any radioisotope-containing material; and attaching a photovoltaic device to the substantially transparent body devoid of any radioisotope-containing material.

The present invention has been described in terms of the preferred embodiment, and it is recognized that equivalents, alternatives, and modifications, aside from those expressly stated, are possible and within the scope of the appending claims.

The invention claimed is:

1. A radioisotope power source comprising:
a first material comprising a polycrystalline scintillator and radioisotope nanoparticles suspended therein, wherein the radioisotope nanoparticles comprise one of 3-H, 90-Sr, 148-Gd, 241-Am, 244-Cm, 232-U, 137-Cs, 60-Co, or 238-Pu;
a second material fully surrounding the first material, wherein the second material defines a shell and the first material defines a core, wherein the second material comprises a polycrystalline scintillator, wherein the polycrystalline scintillator of one of the first material or the second material comprises one of Eu-doped $CaF_2$, Ag-doped ZnS, ZnS, CdS, Eu-doped $Y_2O_3$, or Ce-doped $Y_2SiO_5$; and
a photovoltaic device in light communication with the second material.

2. The radioisotope power source of claim 1, wherein the photovoltaic device fully surrounds the second material.

3. The radioisotope power source of claim 1, wherein the radioisotope power source generates about 1 mW.

4. The radioisotope power source of claim 1, wherein the radioisotope power source generates about 1 μW.

5. The radioisotope power source of claim 1, wherein a volume of the radioisotope power source is less than about 10 $cm^3$.

6. The radioisotope power source of claim 1, wherein the first material and the second material are transparent to one of ultraviolet or visible light.

7. The radioisotope power source of claim 1, wherein the radioisotope nanoparticles are uniformly distributed in polycrystalline scintillator of the first material.

8. The radioisotope power source of claim 1, wherein a useful life of the radioisotope power source exceeds 10 years.

9. The radioisotope power source of claim 1, wherein a useful life of the radioisotope power source exceeds 20 years.

10. The radioisotope power source of claim 1, wherein the photovoltaic device is bonded to the second material via a glass layer.

11. The radioisotope power source of claim 1, wherein the photovoltaic device comprises one of Si, SiC, GaP, GaAs, InP, $GaInP_2$, CdTe, or InGaN.

12. The radioisotope power source of claim 1, wherein an optically transparent grease or epoxy is between the photovoltaic device and the second material.

13. The radioisotope power source of claim 1, wherein a band-gap of a material of the photovoltaic device is selected to match an emission wavelength from one of the first material or the second material.

* * * * *